United States Patent [19]

Parker et al.

[11] Patent Number: 5,225,779
[45] Date of Patent: Jul. 6, 1993

[54] HYBRID MAGNETIC ARESONANCE SPATIAL AND VELOCITY IMAGING

[75] Inventors: Dennis L. Parker, Centerville; Duane D. Blatter, Salt Lake City, both of Utah

[73] Assignee: IHC Hospitals, Inc., Salt Lake City, Utah

[21] Appl. No.: 750,870

[22] Filed: Aug. 28, 1991

[51] Int. Cl.$^5$ .................................. G01R 33/20
[52] U.S. Cl. ........................................ 324/306
[58] Field of Search ............... 324/300, 306, 307, 318, 324/322; 128/653.2, 653.5, 653.3

[56] References Cited

U.S. PATENT DOCUMENTS

| | | | |
|---|---|---|---|
| Re. 32,701 | 6/1988 | Moran | 324/306 |
| 3,191,119 | 6/1969 | Singer | 324/5 |
| 4,516,582 | 5/1985 | Redington | 128/653 |
| 4,574,240 | 3/1986 | Libove | 324/306 |
| 4,602,641 | 7/1986 | Feinberg | 128/653 |
| 4,609,872 | 9/1986 | O'Donnell | 324/306 |
| 4,613,818 | 9/1986 | Battocletti | 324/306 |
| 4,625,169 | 11/1986 | Weeden | 324/307 |
| 4,654,591 | 3/1987 | Moran | 324/306 |
| 4,683,431 | 7/1987 | Pattany | 324/306 |
| 4,694,255 | 9/1987 | Hayes | 324/318 |
| 4,697,147 | 9/1987 | Moran | 324/306 |
| 4,697,149 | 9/1987 | Moran | 324/306 |
| 4,714,081 | 12/1987 | Dumoulin | 128/306 |
| 4,728,891 | 3/1988 | Fuiimura | 324/309 |
| 4,739,766 | 4/1988 | Riederer | 128/653 |
| 4,746,864 | 5/1988 | Satoh | 324/307 |
| 4,780,674 | 10/1988 | Breton | 324/306 |
| 4,782,839 | 11/1988 | Henning | 128/693 |
| 4,796,639 | 1/1989 | Dumoulin | 128/653 |
| 4,803,431 | 2/1989 | Sano | 324/306 |
| 4,836,209 | 6/1989 | Nishimura | 128/306 |
| 4,837,912 | 6/1989 | Suzuki | 324/306 |
| 4,849,697 | 7/1989 | Cline et al. | 324/306 |
| 4,891,779 | 7/1989 | Demeester | 324/309 |
| 4,947,120 | 8/1990 | Frank | 324/309 |
| 4,983,044 | 4/1991 | Case | 324/309 |
| 5,022,397 | 6/1991 | Dumouli | 128/653 |
| 5,093,620 | 3/1992 | Pelc et al. | 324/306 |
| 5,101,156 | 3/1992 | Pelc | 324/306 |

Primary Examiner—Michael J. Tokar
Attorney, Agent, or Firm—David R. Black

[57] ABSTRACT

A method for acquiring spatial and velocity image data for three dimensional magnetic resonance angiography simultaneously by using a stepped bipolar gradient pulse in which the zeroth gradient moment is nulled by the second lobe of the pulse to provide a second echo which encodes velocity information, and spatial information is readout following the first lobe of the bipolar pulse. The preferred embodiment of the invention utilizes a multiple overlapping thin slab acquisition technique which makes possible high quality images for both spatial and velocity signals.

19 Claims, 4 Drawing Sheets

Microfiche Appendix Included
(105 Microfiche, 2 Pages)

HYBRID MAGNETIC ARESONANCE SPATIAL AND VELOCITY IMAGING

BACKGROUND OF THE INVENTION

The present invention relates to nuclear magnetic resonance (MR) imaging and more particularly to a novel method for performing Fourier velocity imaging in combination with MR angiography. The inventive method preferably makes use of a multiple overlapping thin slab (MOTSA) data acquisition method which gives a high-resolution, low-noise signal.

MR imaging techniques can be utilized to detect flowing fluids non-invasively, and are particularly valuable for selectively detecting and imaging the flow of blood in living organisms. Other techniques, such as standard X-ray dye angiographic techniques which require injection of a contrast dye via a catheter, may be used for imaging blood. However, such methods are invasive and not totally benign. MR imaging is non-invasive and is thus much more desirable as a technique for obtaining angiographic images.

Information about blood flow can be of critical importance in diagnostic use. For example, atheromatous plaque, which commonly forms at the bifurcations of the carotid arteries, can cause hemodynamically significant stenosis which may cause transient ischemic attack. Atheromatous plaque can be detected with blood flow imaging techniques. It is desirable to detect atherosclerotic plaque before the occurrence of ulcerization which may result in a brain embolism and stroke. The bifurcations of the carotid arteries are only one area of the human body in which blood flow information is of significance for diagnostic use. The methods described in this specification can be applied equally well to other areas and to subjects other than the human body.

In MR imaging, the object to be imaged is placed in a static magnetic field which causes the spins of the atomic nuclei within the object to become aligned with the static magnetic field. A radio frequency (RF) magnetic pulse applied in a direction perpendicular to the static field causes a change in the state of the nuclei. Following the RF pulse, the nuclei relax back to their original state; the energy released during this relaxation process constitutes the MR signal or "echo." Gradient magnetic fields superimposed on the static magnetic field are used to select the area within the object which will be imaged during a given data acquisition cycle.

MR techniques can be classified as either two-dimensional (2D) projection (similar to conventional X-ray angiography) or three-dimensional (3D). 2D projection imaging techniques, which directly acquire a projection through the subject, are relatively fast but generate only a single view of the areas of interest. Further acquisitions are necessary to obtain additional views. More significantly, all projection techniques are very sensitive to phase dispersion along the projection direction and there is generally significant signal loss due to this phase dispersion.

It is possible to combine many thin slice (non-projection) 2D images to make a multiple thin slice image of a three-dimensional sample volume. Multiple thin slice techniques of this type obtain reasonable images of large and small vessels. However, the images are very noisy because of the small number of signal measurements which are used to generate the image compared to the number of signal measurements used in 3D imaging. There is also signal loss from velocity dependent phase dispersion due to the moderately large slice thickness, which is typically not less than 2 mm.

3D imaging techniques obtain measurements of object density at small points distributed throughout the three dimensional region to be imaged. In 3D imaging techniques, MR signals are measured simultaneously from a three-dimensional volume rather than from individual slices one after another as in two-dimensional imaging. A 3D Fourier transformation is then performed to determine the value of each voxel (the volume unit for which a single measure of the signal is obtained for display as part of the image). The benefits of using a 3D imaging technique include lower noise and smaller voxel dimensions. 3D acquisition techniques have the disadvantage of low blood signal due to the thickness of the 3D slab imaged. Because of the slab thickness, blood remains in the slab for a significant fraction of the imaging time and is saturated by the RF pulse. The saturation of the blood causes its signal to be weaker than the signal from unsaturated, inflowing blood. Such a decrease in signal is especially significant in small vessels with slow blood flow. The loss in vessel detail due to the time blood spends in the slab, as well as to phase dispersion across the dimensions of the voxel, can be reduced with the use of thinner slabs and thus fewer and/or smaller voxels in the acquisition. However, this decreased slab thickness results in a thinner field of view which limits the diagnostic utility of the technique.

The quality of MR spatial images can be improved by the use of a multiple overlapping thin slab acquisition (MOTSA) technique which combines the advantages of 3D MR techniques (lower noise and smaller voxel dimensions) with those of 2-dimensional MR techniques (thin excitation volume which results in minimal signal loss due to RF saturation) and eliminates the drawbacks of both techniques.

MR techniques can be used to measure blood flow velocities, as well as to provide spatial information about flowing blood. By use of a bipolar magnetic gradient pulse in a particular direction, an MR signal can be produced which encodes only the velocity components of blood flow in that direction. The resolution of the velocity measurements can be improved by separating in time the lobes of the bipolar gradient pulse. In addition, the contrast between the flowing blood and stationary tissue can be improved by using a fast gradient echo technique and adjusting the RF gradient spoiling pulses to suppress the signal from stationary tissue.

Prior to the development of MOTSA, it was not possible to obtain data which could be used to simultaneously generate both spatial and velocity images of sufficiently high quality to be useful with the 2D and 3D data acquisition methods available. Velocity measurements employing MOTSA are taken from a small enough region and of sufficient resolution to be usable. Prior art methods may have adequate resolution of the velocity but the measurements are not taken for a small enough region to be useful. None of the prior art methods allow for the simultaneous acquisition of anatomical and velocity images. The slice thicknesses used in 2D and 3D imaging make velocity measurements made with these techniques highly sensitive to pulsatile blood flow. Pulsatile flow, as found in arteries, causes phase dispersion which results in signal suppression.

The inventive method presented herein provides for the simultaneous measurement of spatial and velocity signals, with high resolution and signal-to-noise ratio.

BACKGROUND ART

The following articles and papers describe the background art in nuclear magnetic resonance imaging and flow velocity measurement and are incorporated by reference herein:

1. Nishimura DG, Macovski A, Pauly JM and Conolly SM: MR angiography by selective inversion recovery. Mag. Res. in Med. 4:193-202, 1987.
2. Nishimura DG, Macovski A and Pauly JM: Considerations of magnetic resonance angiography by selective inversion recovery. Mag. Res.in Med. 7:472-484, 1988.
3. Nishimura DG, Macovski A, Jackson JI, et al. Magnetic resonance angiography by selective inversion recovery using a compact gradient echo sequence. Mag. Res. in Med. 8:96-103, 1988.
4. Frahm J, Merboldt KD, Hanicke W, Gyngell ML and Bruhn H: Rapid line scan NMR angiography. Mag. Res. in Med. 7:79-87, 1988.
5. Dumoulin CL, Souza SP and Feng H: Multiecho magnetic resonance angiography. Mag. Res. in Med. 5:47-57, 1987.
6. Dumoulin CL, Souza SP, Walker MF and Yoshitome E: Time-Resolved magnetic resonance angiography. Mag. Res. in Med. 6:275-286, 1988.
7. Dumoulin CL, Souza SP and Hart HR: Rapid scan magnetic resonance angiography. Mag. Res. in Med. 5:238-245, 1987.
8. Chenevert TL, Fechner KP and Gelblum DY: Improvements in MR angiography using phase-corrected data sets. Mag. Res. in Med. 10:38-49, 1989.
9. Wagle WA, Dumoulin CL, Souza SP and Kleine HE: 3DFT MR angiography of carotid and basilar arteries, AJNR 10:911-919, 1989.
10. Dumoulin CL, Cline HE, Souza SP, Wagle WA and Walker MF: Three-dimensional time-of-flight magnetic resonance angiography using spin saturation. Mag. Res. in Med. 11:35-46, 1989.
11. Ruggieri PM, Laub GA, Masaryk TJ and Modic MT: Intracranial Circulation: Pulse-sequence considerations in Three-dimensional (volume) MR angiography. Radiology 171:785-791, 1989.
12. Gullberg GT, Wehrli FW, Shimakawa A, Simons MA: MR vascular imaging with a fast gradient refocusing pulse sequence and reformatted images from transaxial sections. Radiology 165:241-246, 1987.
13. Wehrli FW, Shimakawa A, Gullberg GT and MacFall JR: Time-of-flight MR flow imaging: Selective saturation recovery with gradient refocusing. Radiology 160:781-785, 1986.
14. Keller PJ, Drayer BP, Fram EK, Dumoulin CL, Souza SP: 2D Magnetic Resonance Arteriography of the Neck, Mag. Res. Imag. 7 (suppl 1):186, 1989.
15. Keller PJ, Drayer BP, Fram EK, Williams KD, Dumoulin CL, Souza SP: MR Angiography via 2D-Acquisition yielding a 3D-Display: A Work in progress, Radiology (in press) 1989.
16. Laub GW and Kaiser WA: MR angiography with gradient motion refocusing. J. Comp. Assist. Tomog. 12(3):377-382, 1988.
17. Chao PW, Goldberg H, Dumoulin CL and Wehrli FW: Comparison of time of flight versus phase contrast techniques: Visualization of the intra- and extracerebral carotid artery, Proceedings of the Soc. of Mag. Res. in Med., Amsterdam, Aug, 1989.
18. Masaryk TJ, Modic MT, Ross JS, Ruggieri PM, Laub GA, Lenz GW, Haacke EM, Selman WR, Wiznitzer M and Harik SI: Intracranial Circulation: Preliminary clinical results with Three-dimensional (volume) MR angiography. Radiology 171:793-799, 1989.
19. Parker DL and Gullberg GT: Noise propagation and efficiency in magnetic resonance imaging, Submitted to Med. Phys., 1989.
20. Glover GH and Shimakawa A: POMP (Phase Offset Multi-Planar) imaging: A new high efficiency technique. Proc. Soc. Mag. Res. in Med. Aug. 1988, pp.241.
21. Yuan C, Gullberg GT and Parker DL: The solution of Bloch equations for flowing spins during a selective pulse using a finite difference method. Med. Phys. 14(6):914-921, 1987.
22. Garroway AN: Velocity measurements in flowing fluids by NMR. J. Phys. D: Appl. Phys., 7:159-L163, 1974.
23. Grover T and Singer JR: NMR spin-echo flow measurements. J. Appl. Phys. 42:938-940, 1971.
24. Moran PR: A flow velocity zeugmatographic interlace for NMR imaging in humans. Mag. Res. Img. 1:197-203, 1982.
25. Redpath TW, Norris DG, Jones RA and Hutchison JMS: A new method of NMR flow imaging. Phys. Med. Biol. 29: 891-895, 1984.
26. Dumoulin CL, Hart HR Jr.: Magnetic resonance angiography. Radiology 161: 717-720, 1986.
27. Haacke EM, Lenz G, Modic MT, Bachus R, and Reinhardt E: Quantification of CSF flow and diffusion techniques. In: Book of abstracts: Society of Mag. Res. in Med. Vol. 3. Berkeley; Calif: Society of Mag. Res. in Med. 1055-1056, 1986.
28. Feinberg DA, Mark AS: Human brain pumping of CSF demonstrated by high resolution velocity MRI. In: Book of abstracts: Society of Mag. Res. in Med., Berkeley; Calif: Society of Mag. Res. in Med. 1055-1056, 1986.
29. Feinberg DA, Crooks LE, Sheldon P, Hoenninger J III, Watts J, and Arakawa M: Magnetic resonance imaging the velocity vector components of fluid flow. Mag. Res. in Med. 2:555-556, 1985.
30. Hennig J et al.: Quantitative flow measurement with the Fast Fourier flow technique. Radiology 166:237-240, 1988.
31. Parker DL, Yuan C, Blatter DD: MR angiography by multiple thin slab 3D acquisition. In Press.

MICROFICHE APPENDIX

Reference is made to Microfiche Appendix A, filed herewith, as required by 37 CFR 1.77(c)2. The Microfiche Appendix is on two microfiche sheets and consists of 101 frames of text.

BRIEF SUMMARY OF THE INVENTION

The inventive method described herein relates to methods for imaging spatial and velocity MR signals from moving blood or other fluids. The inventive method provides for the simultaneous measurement of spatial and velocity signals, with high resolution and signal-to-noise ratio. Simultaneous measurement of spatial and velocity components (in a particular direction) is accomplished by applying a bipolar magnetic gradient pulse in that direction and reading out spatial information from the first echo (after the first lobe of the bipolar pulse) and velocity information from the second echo (after the second lobe of the bipolar pulse). The second lobe of the bipolar pulse nulls the zeroth gradient moment, so that the second echo encodes only velocity information.

The inventive method is preferably used in combination with a multiple thin slab (MOTSA) volume image acquisition technique which combines the noise reduction of three dimensional ("3D") acquisition with the reduced signal saturation loss of multiple thin slice techniques ("2D"). However, the inventive method can be used with known 2D and 3D imaging techniques. In the preferred embodiment, images are constructed from thin slabs comprised of multiple thinner slices and a short echo time (a quick readout of the signal) is used, both of which further reduce the sensitivity of the technique to phase dispersion.

DETAILED DESCRIPTION OF THE PREFERRED EMBODIMENT

Figure 1:
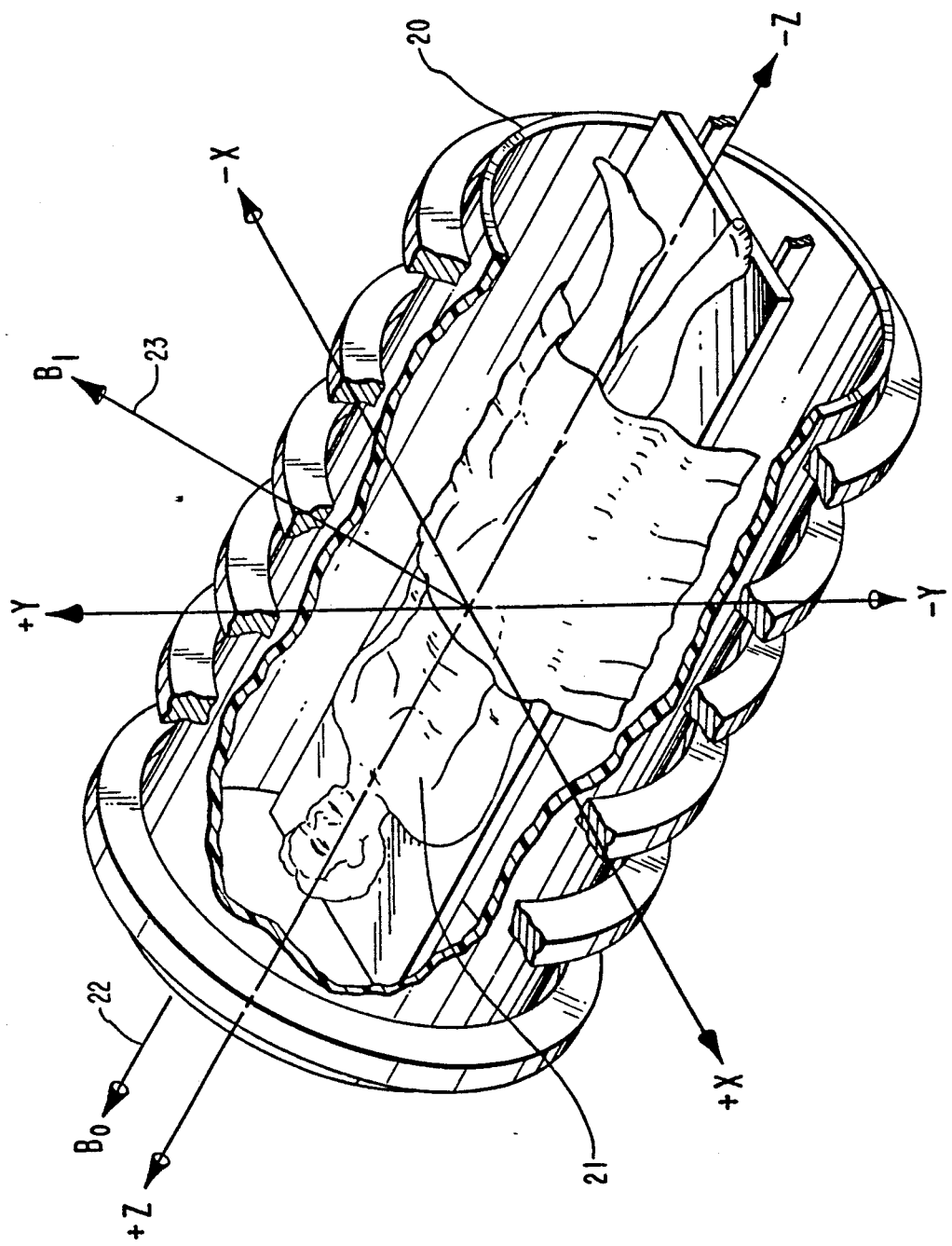
FIG. 1 illustrates a typical arrangement of a MR apparatus depicting a static main magnetic field, $B_o$. Also shown is a RF field, $B_1$.

Referring to FIG. 1, a subject 21 to be imaged is situated in a MR apparatus 20 such as a 1.5 Tesla GE Signa MR scanner where a substantially homogeneous, static magnetic field $B_o$ 22 is directed along the z axis of a Cartesian coordinate system. For convenience, two separate Cartesian coordinate systems are defined. A "physical coordinate system" is fixed in space relative to said MR apparatus. A "logical coordinate system" is not fixed in relation to space and is dependent on the imaging geometry. A physical z axis, in said physical coordinate system, is directed along the bore (cylindrical axis) of said MR apparatus in the direction of the static magnetic field $B_o$ 22. For example, if a human patient is being imaged, the physical z axis aligns with the direction of the patient's feet to head. A physical x direction is usually defined as horizontal and perpendicular to the z direction. A physical y direction is usually vertical and perpendicular to both the physical x and y directions. In the logical coordinate system, a logical z axis is defined as the slab selection direction. This is true in the preferred embodiment where the logical z axis is the direction of the smallest dimension of the thin slab. The logical x and y directions are perpendicular to each other and to the logical z direction. A logical x direction is usually chosen along a wider dimension of the subject or object being scanned. A logical y axis is selected to be the remaining dimension. In a typical case where the subject is lying down, the physical z axis in said MR apparatus and the logical z axis share the same direction. In the typical case, the z axis runs along the length of a subject's body in the MR apparatus.

Figure 2:
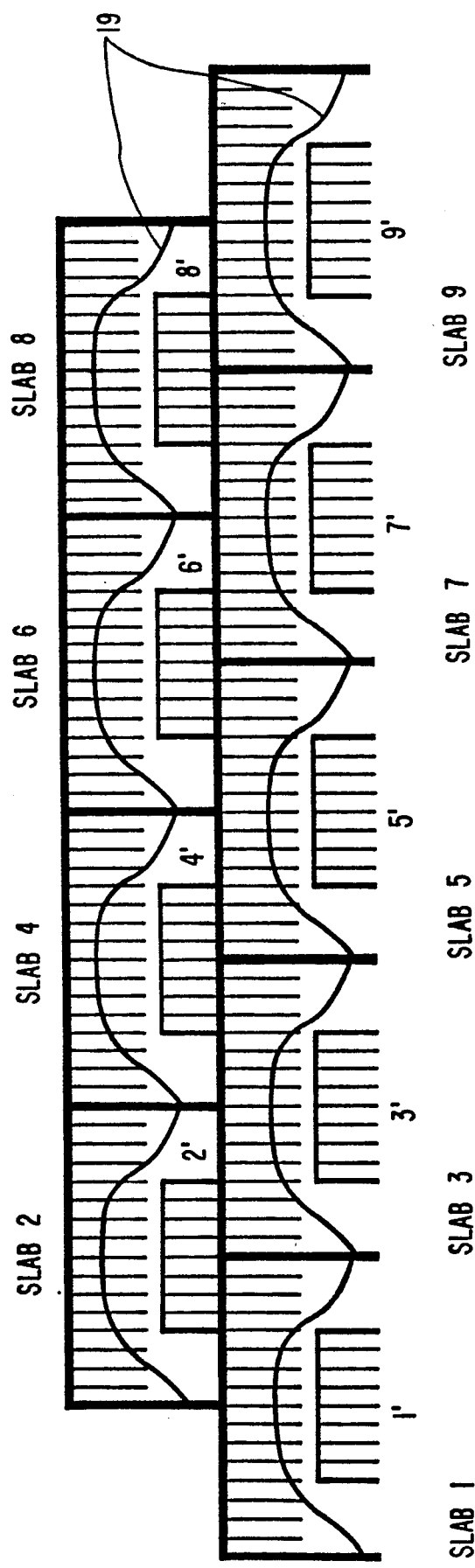
FIG. 2 illustrates multiple overlapping thin slabs (and multiple thinner slices within each slab) over which MR imaging is to be acquired for an area of interest in a subject. Also shown is a slab excitation profile.

A final image data set must be reconstructed from multiple MR signals obtained from a sample in said subject 21 by a receiving coil or coils in said MR apparatus, not shown. The final spatial image data set, in the preferred embodiment, consists of multiple MR signal measurements obtained from multiple, overlapping slabs within said sample each comprised of a multiple of thinner slices. The velocity data set is made up of a measurement of the distribution of velocity values measured over the thickness of the slab. Thus, measurement of the velocity distribution involves a modest loss of spatial resolution. However, the thickness of the slab over which the velocity is measured is sufficiently small so that useful measurements of velocity can be obtained. The thickness of a slab is arbitrary and can be chosen by the operator. Typical slab thicknesses are 12 mm, 15 mm and 30 mm. The number of thin slices within each slab is an arbitrary multiple of two. Typically, values of 16, 32, 64 or 128 slices may be used. The preferred embodiment uses sixteen slices and a slab thickness of 12 mm. FIG. 2 depicts an image area of nine slabs, 1 through 9, where each slab consists of 16 slices. The MR signals obtained from outer slices (i.e. slices near the edge of a slab) are not typically used in the final image data set due to reduced magnetization signal and artifact occurring at outer edges of a slab. The RF frequency (RF) pulse used in MR imaging techniques to cause a precessing magnetization in the slab does not produce as large an effect at outer edges of said slab as in the center portion of said slab. Slab excitation profile 19 shows the reduced magnetization at the outer edges of the slab. The MR signal from areas which are not fully excited is usually disregarded in the final image data set.

Each of said thin slices is comprised of a plurality of three dimensional picture elements. In the preferred embodiment, each slice is comprised of 65,536 picture elements or voxels (256 in the logical x direction by 256 in the logical y direction). The number of said picture elements can be increased to improve the clarity of said final image or reduced to decrease imaging time. In one example, a field of view in said subject is chosen to be 160 mm in the x direction by 160 mm in the y direction by 72 mm in the z direction. Said field of view can be smaller or larger depending upon said subject or the area of a subject to be imaged (i.e. in imaging an ankle or wrist the area to be imaged could be smaller than when imaging a subject's head). In the preferred embodiment, said picture elements are boxes of linear dimension 0.625 mm by 0.625 mm by 0.75, (i.e. 160 mm/256 elements and 12 mm/16 slices respectively).

Once the desired image area is selected, the orthogonal directions of said image area are equated with directions in a standard rectilinear coordinate system. The logical z direction is defined as the direction in which the thin slabs are arranged. In one embodiment, this is the direction of blood flow, and corresponds to the short (72 mm) dimension. For the remaining two directions, the logical x direction is assigned to the wider dimension of said subject (e.g. from shoulder to shoulder). The logical y direction is assigned to the remaining body dimension (e.g. from back to front of the body). In the preferred embodiment, the center of said image area is selected to be the same as the half way or mid point of the center slab of the multiple thin slabs. In FIG. 2, the center of said image area would be in the middle of slab 5. Remaining slabs in the image area are positioned on either side of the center slab.

Referring to the slabs 1 through 9 shown in FIG. 2, an example of nine overlapping slabs is shown. The image area can consist of any number of thin slabs. Each slab is comprised of sixteen thinner slices in the example. The center of said image area corresponds to the center of slab 5. Odd numbered slabs 1, 3, 5, 7 and 9 are situated adjacently. Even numbered slabs 2,4,6 and 8 overlap said odd numbered slabs. For example, the first eight slices of slab 2 overlap the last eight slices of slab 1. The last eight slices of slab 2 overlap the first eight slices of slab 3, as shown. For ease in depicting overlapping slabs, said even numbered slabs in FIG. 2 are shown above said odd numbered slabs. In reality, however, each even numbered slab is situated within the sample image area and overlaps the odd numbered slab on either side.

An example of said slab excitation profile 19 caused by said RF pulse is illustrated within each slab. As described above, the effect of said RF pulse is reduced at the edge of said slab. Said slab excitation profile illustrates the effect of said RF pulse over a slab width. Often the strongest MR signal will be received from center slices within a slab. (However, some shift in strong signal may occur where the strong MR signal is offset toward one end or the other of a slab). For this reason, the center portion of each slab is usually used to prepare said final image data set. The center portion of said slabs are shown in FIG. 2 as 1' through 9'. As can be seen, said final data image set, constructed of contiguous center portions of said slabs, covers the imaged area without interruption.

Typically, imaging of a selected area is performed in such a manner that measurements of MR signals from one entire slab are obtained first. After all the measurements of said first slab image are complete, the measurements for a second entire slab are taken and so forth. As a way of reducing the imaging time, said second slab to be imaged can be selected at a distance from said first slab imaged and the RF pulses and corresponding measurements for both slabs can be alternated between slabs. The "alternating" measurements are taken during a time when no signal measurements could be made in a first slab. Therefore, the measurements made in these time periods make use of this "dead time" and shorten the imaging time. The measurements are alternated between slabs at a distance from each other. Alternating measurements taken from adjacent slabs results in poor signal quality due to the overlap of RF pulse effects and presaturation of inflowing blood from one slab to the next. The imaging procedure is set forth below.

When exposed to a strong, static, magnetic field, 22 parallel to the z direction, as shown in FIG. 1, randomly oriented protons in said subject 21 align with said strong, static magnetic field. Said static magnetic field is applied along the length (i.e. physical z direction) of said subject by use of an electric current in a coil or coils in said MR apparatus 20. A gradient magnetic field is applied by a separate coil or coils in said MR apparatus along the logical z axis to select the slab to be imaged, as shown in FIG. 1-C.

A small radio frequency magnetic field 23 oscillating at the Larmor Frequency, corresponding to the total static magnetic field 22 at the location of said slab, is applied in the plane orthogonal to the physical z axis. The effect of said radio frequency magnetic field is localized to said slab due to a magnetic field perturbation caused by said magnetic field gradient in the logical z direction. The strength of the net magnetic field at the location of said slab determines the frequency required to tip nuclear spins in a sample and cause the precessing magnetization. In the preferred embodiment the nuclear spins are those of protons in the material or sample. The frequency required to tip nuclear spins is the Larmor Frequency. The relationship of the Larmor Frequency to the strength of said magnetic field is given by the equation:

$$f = \gamma B_o / 2\pi$$

where f is the frequency in Hertz and $\gamma$ is the gyromagnetic ratio, which is a constant.

Transverse magnetization in said slab is thus created by applying said RF magnetic field 23 called $B_1$, in a manner such that said RF field rotates synchronously with the precessing nuclear magnetization.

The introduction of said radio frequency magnetic field at the Larmor Frequency causes said aligned nuclear magnetization to tip relative to the physical z axis into the physical x-y plane. Said tip in the aligned nuclear magnetization is due to a torque caused by the introduction of said RF magnetic field at the Larmor Frequency, which has been introduced at a right angle to the physical z axis. Said torque causes a rotation of said nuclear magnetization about said RF magnetic field 23 into the physical x-y plane. Once rotated away from the physical z axis, said nuclear magnetization precesses about the physical z axis at the Larmor Frequency. The combined precession of magnetization in the physical x-y plane creates a macroscopic magnetic moment that is responsible for the induction of an electric signal. The signal is detected as a voltage in a receiver coil or coils in said MR apparatus 20.

Figure 1A:
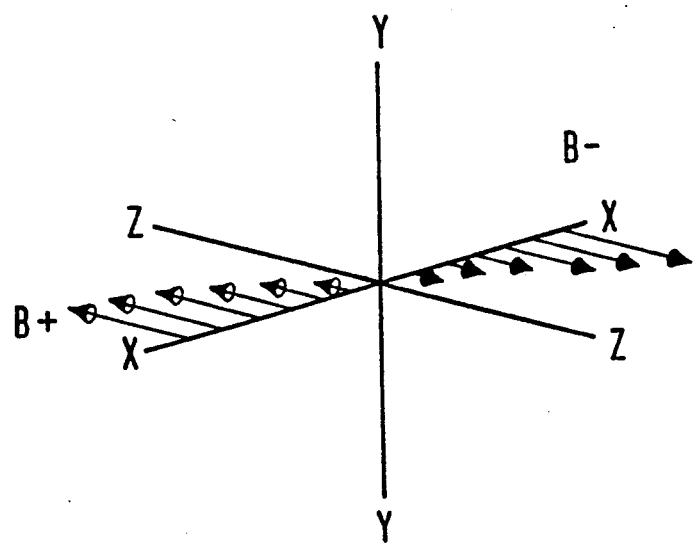
FIGS. 1A, 1B, and 1C depict the gradient magnetic fields generated in a MR apparatus in the logical x, y and z directions respectively.
Figure 1B:
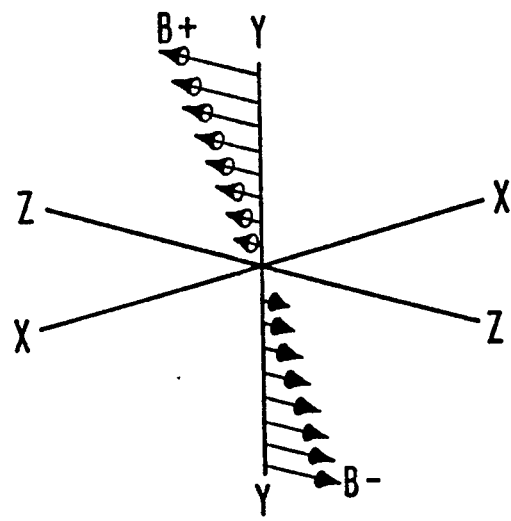
Figure 1C:
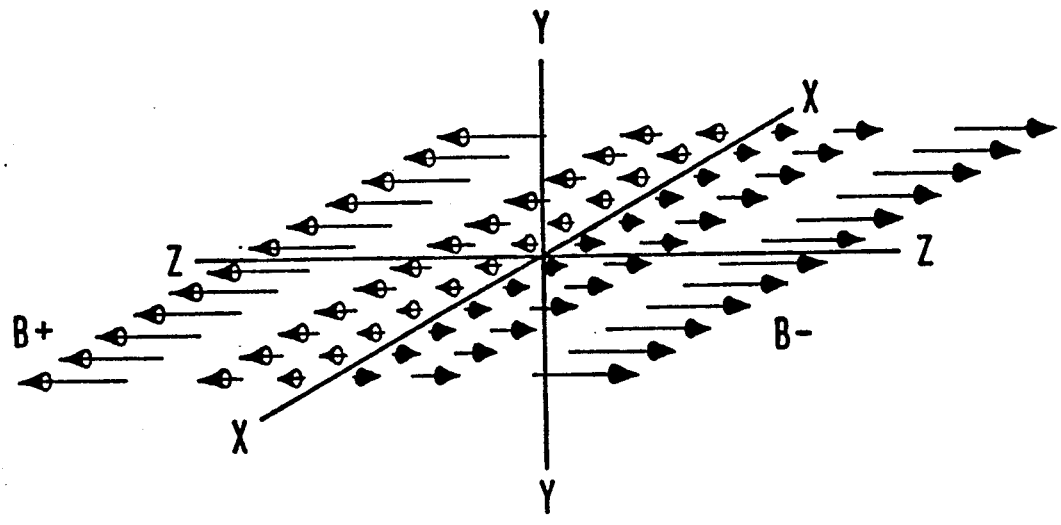
Figure 3:
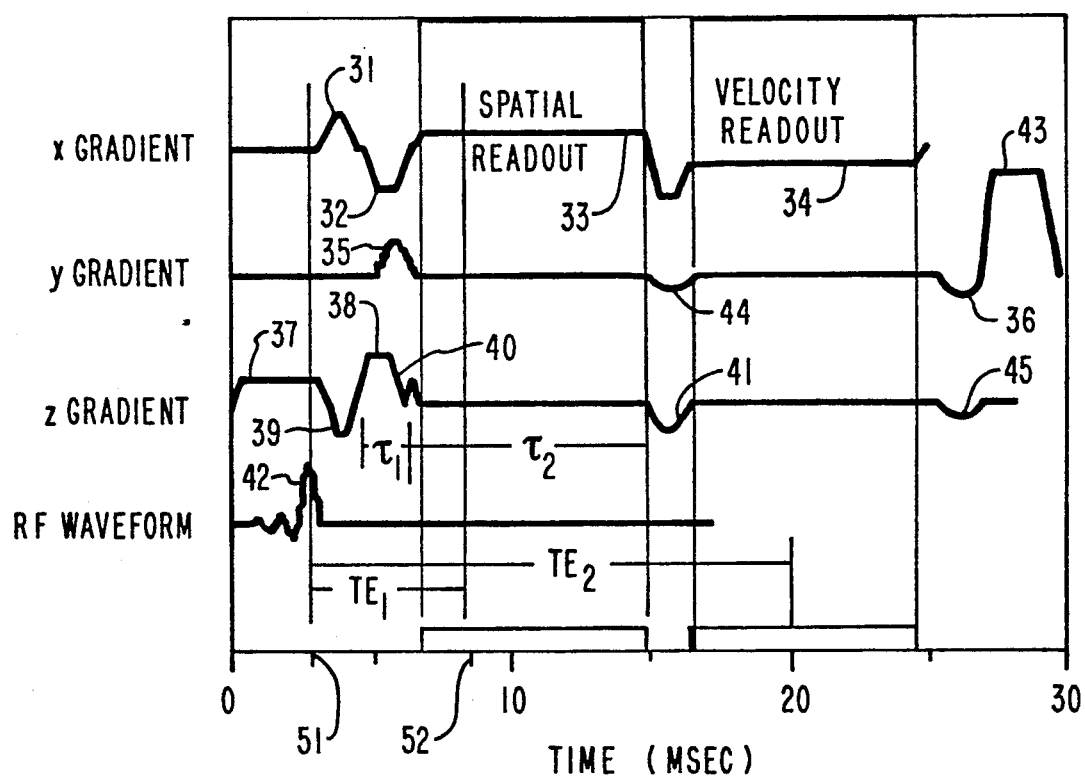
FIG. 3 illustrates an example of a multislab magnetic gradient waveform used during one radio frequency pulse.

The imaging process is made possible by variations of the magnetic field gradients within the imaging area. A field gradient in the logical x direction is shown in FIG. 1A and a field gradient in the logical y direction is shown in FIG. 1B. Measurements in the imaging process depend upon variations of a specific sequence of said magnetic field gradients (in the logical x,y and z directions) and said RF waveforms applied as a pulse (at the Larmor Frequency for each slab) and introduced at a right angle to the physical z axis. By way of example, a timing diagram for a representative gradient waveform and radio frequency pulse is shown in FIG. 3. Said magnetic field gradients, as shown in FIG. 3, cause time-dependent spatial variations superimposed on the static, main, magnetic field 22 in the x, y and z directions. The RF pulses generate a synchronously rotating magnetic field that is oriented orthogonally to said static, main, magnetic field. The application of said sequence of magnetic field gradients and RF pulse is controlled by a computer program. A copy of the source code of said computer program is attached hereto as Microfiche Appendix A. Microfiche Appendix A is incorporated herein by reference and is part of this specification and description of the invention.

The intensity of a MR signal obtained in said receiver coil or coils in said MR apparatus 20 is a function of the angle to which said magnetization is tipped into the x-y plane by said RF pulse. The angle of the tip is proportional to both the amplitude and duration of said RF pulse. Since pulse duration is optimally kept to a minimum in order to decrease MR signal loss before MR signal readout, the amplitude of said RF pulse is increased to correspondingly increase the tip angle $\alpha$. The signal from any given excitation pulse of tip angle $\alpha$ is proportional to transverse magnetization $M^+$, which can be written:

$$M^+ = M_z(0^-) \sin \alpha e^{-TE/T_2}$$

where $M^+$ is the magnitude of transverse magnetization at the time of measurement, $T_E$; $T_2$ is the transverse magnetization relaxation time; $\alpha$ is the tip angle; and $M_z(0^-)$ is the z component of said magnetization (along the static field direction) just before an RF excitation pulse is applied. For example, when blood enters a region of interest, the pre-pulse magnetization, $M_z(0^-)$, is equal to an equilibrium value of magnetization, $M_o$. For subsequent excitation pulses it is necessary to determine $M_z(0^-)$ from Bloch's equations. Solving Bloch's equations for the z component of magnetization after one excitation of tip angle $\alpha$ gives:

$$M_z(t) = M_o[1 - (1 - \cos\alpha)e^{-t/T_1}]$$

and after N excitation pulses which produce tip angle $\alpha$ the magnetization signal from the blood can be expressed:

$$M^+_N = A + B\epsilon^N$$

where:

$$E = e^{-TR/T_1}$$
$$\epsilon = E\cos\alpha$$
$$A = \frac{1 - E}{1 - E\cos\alpha} M_o e^{-TE/T_2} \sin\alpha$$
$$B = \frac{E - E\cos\alpha}{1 - E\cos\alpha} M_o e^{-TE/T_2} \sin\alpha$$

$T_R$ = Repetition time between each subsequent RF pulse and
$T_1$ = longitudinal relaxation time A 90° tip angle will result in large blood signal for the first RF pulse and in a minimal blood signal or a signal equivalent to that of stationary tissue for subsequent RF pulses. Any tip angle significantly greater than 0° and significantly less than 90° can provide some blood contrast signal for all RF pulses. An optimum tip angle of 30° is used in the preferred embodiment but comparable results have been found using tip angles of 20°-50°.

One example of the magnetic gradients and RF pulse is shown in FIG. 3. Measurements of said MR signal in a slab are taken while a gradient is applied in the logical x direction. Thus, the logical x direction is the "readout" direction. Magnetic gradients are applied in the logical x direction to provide for a spatially encoded MR signal. The magnetic gradient in the logical x direction is comprised of lobes 31 and 32 and readout gradients 33 and 34 which represent levels of magnetic gradient in the logical x direction. Said lobes 31 and 32 precede actual MR signal readout. Readout of spatial information is performed during the application of spatial readout gradient 33 and readout of velocity signals is performed during the application of velocity readout gradient 34. Lobes 31 and 32 in said gradients in the logical x direction serve to provide null zeroth and first moments of said spatial readout gradient waveform 33 at the time of the echo center 52. Both the zeroth and first gradient moments must be zero simultaneously at the time of the echo center 52 in order to obtain a strong MR signal from flowing fluid. A nonzero gradient moment would result in a weak and possibly unusable MR signal due to randomness of the precessing spins in the physical x-y plane. Said spins would cancel each other out rather than provide a magnetic moment which could be "read" by said receiver coil or coils in said MR apparatus 20.

Echo signal measurements are obtained during the application of said spatial and velocity readout gradients. Application of the logical x direction spatial readout magnetic gradient spatially encodes the MR spatial signal from the slab in the logical x direction. Since said MR spatial signal must later be reconstructed to signal image data by use of a Fourier Transform in a reconstruction algorithm, the encoding from the readout gradient is necessary to place said MR spatial signal properly in the logical x direction. Similarly, application of the logical x direction velocity readout magnetic gradient spatially encodes the MR velocity signal from the slab in the logical x direction. Since said MR velocity signal must later be reconstructed to signal image data by use of a Fourier Transform in a reconstruction algorithm, the encoding from the readout gradient is necessary to place said MR velocity signal properly in the logical x direction.

Readout of said MR signals in the logical x direction is obtained over said readout period for each of a multitude of pulse sequence repetitions. In the preferred embodiment, said readout period begins at 4.0 milliseconds after a Time Zero 51 (Time Zero is the center of the main lobe of each RF pulse waveform) and runs until approximately 12 milliseconds after Time Zero. An echo center 52 of said spatial readout period occurs where the zeroth and first magnetic gradient moments in the logical x axis are zero. The strongest spatial signal is received at this point in time. Said magnetic gradient moment is zero at the time where the area under lobes 31, 32, and the first part of said spatial readout gradient 33 equal zero.

A spatial phase encoding y magnetic gradient 35 encodes the position of the imaged area in the logical y direction. Encoding a MR signal received by said MR apparatus in the logical y direction allows a Fourier Transform in said reconstruction algorithm to image properly said MR signal in the logical y direction. Said y direction spatial phase encoding gradient is stepped through a multitude of amplitude values during each imaging sequence to cover all values of y selected by the operator. In the preferred embodiment, each slab has 256 voxels in the y direction. Said y gradient is stepped through each of the 256 amplitude values to encode the slab for imaging. When blood flow is in the logical z direction only, a stepped y gradient pulse 36 is applied. Said stepped y gradient pulse is of negative polarity and equal in area to said first gradient 35 and provides phase rewinding. Such phase rewinding removes any gradient-caused spatial dependence of the transverse magnetization. In this case, a stepped y gradient pulse 44 is zero and the stepped y gradient pulse 36 provides phase rewinding in the logical y direction. Should the blood flow velocity encoding direction be in an arbitrary direction in the y-z plane, rotated at an angle $\theta$ relative to the logical z direction, a second stepped y gradient pulse 44 is used for y component velocity phase encoding (as well as providing part of the y direction phase rewinding) and a third y gradient pulse 36 is required to complete phase rewinding. Said second and third y gradient pulses are related to the angle $\theta$. It can be shown that when $\theta$ is 0 degrees, there is no tip into the y-z plane and the second y gradient pulse 44 is unnecessary. Similarly, if the angle $\theta$ were 90 degrees, (i.e. tipped entirely into the logical y direction)

the third y gradient pulse 36 would be zero and the second y gradient pulse 44 would complete the phase rewinding for the y gradient.

A first magnetic gradient 37 in the logical z direction is used to select a slab to be imaged. Said first magnetic field gradient 37 is used in combination with flow compensation gradients 39 and 40 which null the zeroth and first moments of the z gradient waveform at the center of a second magnetic field gradient 38 in the logical z direction. Said second magnetic field gradient in the logical z direction, 38, is a slice phase encoding waveform and is applied in the logical z direction to provide spatial phase encoding for said slices within said slab to be imaged.

In the presence of said z magnetic field gradient, the net static magnetic field, which is the sum of the initial magnetic field $B_o$ and the spatially variant gradient magnetic field, varies as a function of position in the logical z direction. The Larmor Frequency is proportional to said net static magnetic field and hence also changes as a function of position in the logical z direction. Said slab to be imaged is selected by applying said magnetic gradient 37 in the logical z direction and applying a RF magnetic field waveform. The RF magnetic field waveform is made up of a continuum of frequencies that are equal to the continuum of Larmor Frequencies within said slab.

Said flow compensation magnetic gradients 39 and 40 in the logical z direction serve to null the zeroth and first moments of said slab selection magnetic gradient, 37. As in the logical x gradient, the zeroth and first gradient moments for gradients in the z direction must be zero in order to obtain signals from flowing blood. Said slice phase encoding waveform 38 is stepped through several amplitude values during the imaging sequence for an entire slab. In the case of a slab of sixteen slices, said slice phase encoding waveform 38 will be stepped through sixteen amplitudes. When the blood flow is in the logical z direction, following the readout of spatial data a third gradient 41 is applied in the logical z direction to cause a second echo which encodes blood velocity. To encode velocity in logical z direction, gradient 41 is equal in area and opposite in sign to said slice encoding waveform 38 and serves to null the zeroth moment of the gradient in the logical z direction. Said third magnetic field gradient 41 is also used to rewind z velocity phase encoding. When the zeroth moment of the gradient is equal to zero, the MR echo signal is dependent primarily on the velocity of the blood. The velocity readout gradient 34 is applied in the logical x direction after said third z direction gradient 41 has been applied to zero the zeroth moment of the z gradient. Preferably this occurs 11.2 milliseconds after the first lobe of the z direction bipolar pulse (i.e. slice phase encoding waveform 38).

As described above, when the blood flow velocity is encoded at some angle in the y-z plane, said third z gradient pulse 41, which is used to null the zeroth moment of the z gradient, is not equal in area to said second slice phase encoding waveform 38 and does not provide complete phase rewinding. A fourth magnetic field gradient in the logical z direction 45 is necessary to complete rewinding of the z phase velocity encoding. The values of the z phase rewinding pulses 41 and 45 are related to the velocity encoding angle $\theta$ in the y-z plane. It can be shown that in the case where $\theta$ is equal to 0 degrees, z gradient pulse 45 is zero. When $\theta$ is 90 degrees z gradient pulse 41 is zero. For all values in between the two values are related to the value of the angle $\theta$.

A randomizing waveform 43, is used to reduce any signal at the conclusion of said imaging sequence. Said randomizing waveform 43 acts to spoil said MR signal before a next imaging pulse is received. Said randomizing waveform is shown in the y gradient direction in FIG. 3, but in practice it may be applied in any of the logical coordinate directions.

A RF pulse waveform 42, is used to prepare magnetization within a selected slab to give a signal for imaging. As described above, said magnetization caused by said precessing magnetization in the physical x-y plane is related to said RF pulse used to tip said magnetization into the x-y plane. An effective frequency band of said RF pulse is chosen to correspond to said slab's location and width within a sample. In order to increase the strength of said MR signal obtained, said RF pulse waveform is stopped at the first zero (Time Zero 51) after a main central lobe. Truncation of said RF pulse at this point (rather than allowing the waveform to completely play out in a symmetrical form) allows for an earlier reading of said MR signal. Early reading of said MR signal results in a stronger signal being received by said receiving coil or coils in said MR apparatus.

In the preferred embodiment, the imaging process for the sixteen images (slices) of the first slab require that the sequence (an example of which is shown in FIG. 3) be repeated 4096 times (16 slices in the logical z direction x 256 values in the logical y direction). Readouts are taken along the entire x direction of the slab (256 values) for each RF pulse. Where blood flow is in the logical z direction only, each repetition of the sequence is performed with a unique combination of values of the y magnetic gradient waveform 35 and the z magnetic gradient waveforms 38 and 41. The z magnetic gradient waveform 41 has the same area as gradient 38, but is of the opposite sign. A description of the use of the inventive method for blood flow phase encoding rotated into the y-z plane is given later in this specification. The area under the lobe of the z magnetic gradient waveform 38 (denoted $A_z$) has one of $N_z$ values given by:

$$A_z = 2\pi \frac{j - (N_z + 1)/2}{(\gamma)FOV_z}$$

where j is the index that takes on the integer values between 1 and $N_z$, where $N_z$ is the number of images in the section (e.g. sixteen slices per slab in the preferred embodiment); and $FOV_z$ is the total thickness of the $N_z$ slices: $FOV_z = N_z \times w_z$, where $w_z$ is the thickness of (and spacing between) each slice.

An area under the y magnetic gradient waveform 35, (denoted $A_y$) has one of $N_y$ values given by an expression similar to the equation above.

$$A_y = 2\pi \frac{k - (N_y + 1)/2}{(\gamma)FOV_y}$$

where k is an index that takes on the integer values between 1 and $N_y$, where $N_y$ is the number of picture elements in the logical 'y' direction (e.g 256 in the preferred embodiment) and $FOV_y$ is the dimension (in centimeters) of the image area in the logical y direction, (e.g. $FOV_y = N_y \times w_y$); where $w_y$ is the width (and spacing between) each picture element in the logical y direction The units in the above area equations are Gaussseconds per centimeter and can be computed and specified on any MR apparatus. For ease in describing the inventive technique, arbitrary directions for x, y and z have been chosen and used throughout this specification and the drawings However, it is within the scope of the inventive technique that the rectilinear coordinate system may be rotated and the magnetic gradient waveforms adjusted to be oriented in any arbitrary configuration.

In general, the signal which is obtained during MR Fourier imaging can be expressed as:

$$S(k,q) = K \int \rho(r,V) e^{i(k \cdot r + q \cdot V)} dr dV$$

where $$k = \int_0^t \gamma G(t') dt'$$

$$q = \int_0^t \gamma G(t') t' dt'$$

$\gamma$ is the gyromagnetic ratio, G is the magnetic gradient, and $\rho(r,V)$ is the spin density of the nuclei having position between r and r+dr and velocity between V and V+dV. In the above equations the variables k, Q, G, r, V are all vector quantities. In the preferred embodiment of the invention, the flow encoding is performed in the logical z direction. Therefore, only the z component of these quantities are considered in the subsequent equations. In order to obtain a signal which encoded only velocity in the z direction, a second z gradient pulse 41 was applied which nulled the zeroth gradient moment, $G_z(t)dt$. The velocity dependent phase in the second echo is $$\phi_v = \gamma V_z \int_0^{TE_2} G_z(t) t dt = -\gamma V_z A_z \tau$$

where $TE_2$ is the time from Time Zero 51 to the center of the second echo for velocity readout, and $\tau$ is the time between the start of the first lobe and the start of the second lobe of the bipolar pulse, and as above, $A_z$ is the area under each lobe of the z gradient bipolar pulse. From the definition of the argument of the discrete Fourier transform, $$\gamma j \Delta V_z j' \Delta A_z \tau = 2\pi j j' / N_z$$

where j and j' are the Fourier indices, and other values are as defined previously. The velocity measurement resolution can be obtained from the above relation as follows:

$$\Delta V_z = \frac{2\pi}{\gamma \Delta A_z \tau N_z} = \frac{w_z}{\tau}$$

Thus, it can be seen that velocity resolution is dependent on the slice thickness and the time between the two lobes of the bipolar gradient. It is preferred that the time between the two lobes of the bipolar pulse be greater than or equal to 11.2 milliseconds. For a slice thickness of 0.75 mm, the resulting velocity resolution will then be 6.7 cm/second or better.

In the preferred embodiment, it is preferable to image velocity in the logical z direction (the shortest dimension of the thin slab). It is also possible to image flow which has components in both the logical y and logical z directions. This can be accomplished by delivering bipolar gradient pulses in both the logical y and logical z directions to encode the velocity components in both these directions. This example is shown in FIG. 3. In this case, the second lobe of both the y and z velocity phase encoding pulses are not equal in area to the first lobes, but have values which depend on the phase encoding indices. Thus, the y gradient pulse 44 and the z gradient pulse 45 are non-zero. If, for example, the direction of velocity phase encoding is rotated into the y-z plane by an angle $\theta$ relative to the z axis, the second phase encoding pulse lobes for the jth y phase encoding and kth z phase encoding playout when the first y phase encoding gradient pulse has an area $A_{yj}$ and the first z phase encoding gradient pulse has and area $A_{zk}$ are given by the relationships:

$$A'_{yjk} = -A_{yj}\sin^2\theta - A_{zk}\cos\theta\sin\theta$$

$$A'_{zjk} = -A_{zk}\cos^2\theta - A_{yj}\cos\theta\sin\theta$$

The MR signal obtained during the readout period will thus encode a velocity with components in the y and z directions (or in the y-z plane).

Following this velocity readout gradient, a third y gradient pulse 36 having an area $-A'_{yjk} - A_{yj}$ is applied to complete phase rewinding in the y direction. Similarly, a fourth z gradient pulse 45, having an area $-A'_{zjk} - A_{zk}$ is applied following the velocity readout gradient to complete phase rewinding in the z direction.

The technique of resolving two velocity components will preferably be used for small values of $\theta$ (i.e. velocity phase encoding is rotated from the logical z direction a small amount). However, it is intended that the scope of the invention encompasses applications of the technique involving all values of $\theta$.

Referring now to FIG. 2, in order for an image to be acquired from thin, overlapping slabs (through utilization of the MOTSA technique which is used in the preferred embodiment of the invention), difficulties in MR imaging must be overcome. First, the center portion of an area to be imaged in said MR apparatus will not always align exactly with an arbitrary "zero" position in the MR apparatus. The "zero" position in said MR apparatus is set by the internal hardware of said MR apparatus. It is well known, and can be demonstrated mathematically, that a generation of image data from MR signals in a sample causes an infinite number of copies of said image data to be replicated in the z direction with a spacing equal to the chosen field of view in the z direction. A reconstruction algorithm will reconstruct image data occurring between set boundaries given by a field of view in the z direction centered at said "zero" position of said MR apparatus. Thus, if image data extends beyond the boundaries of a reconstructed field of view, the replication of said image data will cause said image data to reappear at the other end of said reconstructed field of view. This quality of MR imaging is due to the Fourier Transform in the reconstruction algorithm and is often referred to as "spatial aliasing" or "wraparound". If a region imaged is shifted by exactly one field of view distance from the central field of view, a reconstruction algorithm will reconstruct an exact replica of said image data that occurs in said central field of view.

If a region imaged is shifted by some fraction of a field of view width from the central field of view, it is necessary to perform an operation which shifts the image data back to the center of a field of view. Said shift is accomplished by multiplying measurement data by a complex number that has a magnitude of one and a phase that is a product of a phase encoding index, k, and a constant that is $2\pi$ times said fractional field of view shift. This multiplication is accomplished by making the direction of said RF pulse equal to the desired phase angle. By way of example, if the offset of a center of a slab (to align properly an image within a field of view,) is one tenth of a slab width, said RF pulse is rotated 36° (360°×1/10).

In the preferred embodiment, said overlapping slabs are purposely shifted one-half of a slab width from the previous slab and continued in this overlapping fashion over the entire imaged area. However, slabs can be shifted or overlapped any amount. To carry out this shift of one half slab width (i.e., the overlapping of slabs), said RF pulse must be rotated 180° (360°×½) for each subsequent index, k, of said z phase encoding for all even numbered slabs in FIG. 2. The even numbered slabs are the slabs for which the replicated image data is offset by one half slab width from a slab centered in said MR apparatus. Stated another way, a shift of one half slab width corresponds to a rotation of one half of 360° for each subsequent z phase encoding.

A reconstruction algorithm also adjusts to compensate for an artifact due to a DC or slowly changing error signal that is independent of said MR signal. Because this error signal is slowly varying, an artifact that results occurs in the center of an imaged slab. By multiplying said MR signal for each z phase encoding by either $+1$ or $-1$, that is $(-1)^k$ where k is said z phase encoding index, said artifact is shifted to the edge of said images. This product would also cause a shift in said image data unless said RF pulse is also rotated by additional 180° for each subsequent z phase encoding.

Because of the two types of rotation of the RF pulse (first, to compensate for wraparound problems in the overlapping slabs and second, to compensate for the moving of said artifact to the edge of the slab image) the total rotation increment for slabs that are centered on the central field of view (i.e. slabs 1,3,5,7 and 9 in FIG. 2) is 180° in the preferred embodiment. Rotation of said RF pulse for slabs that are shifted by ½ of the field of view (the even slabs of FIG. 2) is 180° (to compensate for wraparound)+180° (to shift said artifact to the edge of said images)=360° of rotation. This total rotation of 360° is equivalent to no rotation at all (i.e. 0°=360°). In FIG. 2, the slices in the odd numbered slabs have a coefficient of said RF pulse that alternates between 1 and $-1$. (0°, 180°) For the even numbered slabs the coefficient of said RF pulse does not alternate due to the additional 180° rotation of the RF pulse required to shift the overlapping slab. (0°,360° etc). Stated another way, a rotation of 180° for the shift of said overlapping slab added to the alternating rotation of 180° to move the artifact to the edge of the slab image, results in a coefficient of $+1$ for each said RF pulse (i.e., $1\times1=+1$; and $(-1)\times(-1)=+1$; etc.).

When a group of slabs are all shifted by a small fraction of the field of view, (to center the subject to the "zero" position said MR apparatus for instance) a rotation to compensate for this shift must be added to the fundamental rotation for all slabs. Thus, for example, if the slabs are offset by 1/72 of the field of view width, to center the subject in the MR apparatus, said RF pulse must be rotated 5° (360°×1/72). Therefore, a sequence of RF pulses as a function of the z phase encoding index, k, would be:

| index | odd slabs | even slabs |
|---|---|---|
| 0 | 0° | 0° |
| 1 | 185° | 5° |
| 2 | 10° | 10° |
| 3 | 195° | 15° |
| 4 | 20° | 20° |
| . | . | . |
| . | . | . |
| . | . | . |
| etc. | | |

It must be noted that the shift of said overlapping slabs need not always be one-half slab width. The inventive technique provides for an arbitrary slab shift in the manner described below.

To simplify the analysis of an arbitrary shift in slab overlap, only the imaging equation in the z direction is considered. Imaging in the x and y direction is performed using standard MR imaging techniques known by those skilled in the relevant art. By tailoring said RF pulse, a profile $W_j(z)$ and the relative phase $c_e(k,j)$ of the transverse component of the magnetization of the excited slab can be chosen. For slab j, the kth phase encoded received signal is:

$$s_{k,j} = \int c_e(k,j)\, W_j(z) m(z)\, e^{2\pi i \gamma'(zk\alpha A_z)}\, dz + s_n$$

where $s_n$ is said slowly varying error (noise) signal and $\Delta A_z$ is said incremental area under said z phase encoding gradient. The value $\Delta A_z$ is determined by the desired slice thickness $w_z$ and the argument required by the definition of a discrete Fourier Transform:

$$\gamma' w_z \Delta A_z = \frac{1}{N_z}.$$

For each slab, the reconstructed magnetization, m', is obtained as the inverse Fourier Transform of $s_{j,k}$ for k slices. The magnetization for slice k' of the jth slab is given by $$m'(D_j + k'w_z) = \sum_{k=-(N_z-1)/2}^{(N_z-1)/2} (-1)^k s_{k,j}\, e^{-2\pi i \frac{kk'}{N_z}} \Delta f_z$$

Where $D_j$ is the location of the center of the jth slab. The reconstructed image, m, consists of a signal term (due to the magnetization in the object $m(z)$), and an error term due to $s_n$. The coefficient $(-1)^k$ is used with said RF pulse as described above to move said artifact, due to $s_n$ to the edge of the reconstructed slab in the image. When $s_n$ remains constant the error term due to $s_n$ becomes:

$$\frac{1}{Z} \sum_{k=-(N_z-1)/2}^{(N_z-1)/2} (-1)^k s_n\, e^{-2\pi i \frac{kk'}{N_z}} =$$

-continued $$\frac{1}{Z} s_n \frac{\sin\left[\pi\left(k' + \frac{N_z}{2}\right)\right]}{\sin\left[\frac{\pi}{N_z}\left(k' + \frac{N_z}{2}\right)\right]} = \frac{1}{w_z} s_n \delta_{k' \pm N_z/2}$$

which, for images reconstructed, is only significantly different from zero for $k' = +/-N_z/Z$ (i.e. at the edge images). Thus, an image term can be written:

$$m'(D_j + k'w_z) = \frac{1}{Z} \int W_j(z) m(z) \sum_{k=-(N_z-1)/2}^{(N_z-1)/2} (-1)^k c_e(k,j) e^{2\pi i \frac{k}{N_z}[\frac{z}{w_z} - k']} dz$$

To simplify this equation, the function of said RF excitation can be written:

$$c_e(k,j) = (-1)^k e^{\pi i k \phi_j}$$

Where $(-1)^k$ compensates for the $(-1)^k$ in the reconstruction algorithm and where $\phi_j$ is the phase movement for the jth slab. Substituting provides:

$$m'(D_j + k'w_z) = \frac{1}{Z} \int W_j(z) m(z) \frac{\sin\left(\frac{\pi N_z}{Z}[z - k'w_z + \phi_j Z/2]\right)}{\sin\left(\frac{\pi}{Z}[z - k'w_z + \phi_j Z/2]\right)} dz$$

The trigonometric ratio in the above equation is periodic (with period Z) and is nearly equal to the trigonometric identity sin(x)/x for small values of x. To the extent that m(z) is relatively constant over a central region of a slab where the ratio is largest, the ratio, above, can be approximated as a string of delta functions:

$$\frac{1}{Z} \frac{\sin\left(\frac{\pi N_z}{Z}[z - k'w_z + \phi_j Z/2]\right)}{\sin\left(\frac{\pi}{Z}[z - k'w_z + \phi_j Z/2]\right)} \approx$$

$$\sum_j \delta\left(z - k'w_z + \frac{\phi_j Z}{2} - jZ\right)$$

In order to reconstruct the image at a proper location in the z direction, it is necessary that at least one term of the summation be zero (for some slab value j') when $z = D_j + k'w_z$; where $D_j$ is the position of the slab center for the jth slab and $k'w_z$ is the position of slice k' (of width and spacing $w_z$) within a slab. This argument can be expressed as $$D_j + k'w_z - k'w_z + \frac{\phi_j Z}{2} - j'Z = 0$$

which can also be expressed as $\phi_j - 2D_j/z + 2j'$.

Images can thus be reconstructed with arbitrary slab center offset positions (e.g. $D_j$) by controlling the phase of the excitation pulse:

$$c_e(k,j) = (-1)^k e^{-2\pi i k D_j/Z} e^{2\pi i k j'} = (-1)^k e^{-2\pi i k D_j/Z}$$

To avoid wraparound (i.e. contributions from other regions specified by different values of j', $W_j(Z)$ must be tailored not to excite magnetization outside of a region imaged $(D_j + / -Z/2)$. This is accomplished by defining a window function:

$W_j(z) = 1$ for $D_j - fZ/2 < z < D_j + fZ/2$ $W_j(z) = 0$ for all other values.

Because an excited profile of a slab is nonzero in a region slightly wider that the window function (i.e. spillover), the ratio of the width of the excited slab to the imaged slab width Z must be on the order of one or less.

The temporal shape of said RF pulse used to obtain a nearly rectangular slab excitation profile is determined from the net static magnetic field within the boundaries of said slab to be excited. The net static magnetic field is the sum of the initial static magnetic field, $B_o$, and the spatially variant gradient magnetic field in the logical z direction. The temporal shape of said RF pulse is approximately the shape that provides a uniform frequency distribution that is equal to the Larmor frequency distribution within said slab to be excited. The amplitude of said RF pulse can be increased or decreased to increase or decrease the tip angle of magnetization within said slab. An arbitrary phase (direction in the x-y plane) for each excitation can be chosen and thereby vary the net direction of the transverse magnetization (in the x-y plane). Said RF excitation pulse used for the kth phase encoding of the jth slab selection can be represented:

$$B_1(t) = \frac{c_e(k,j)}{fZ} \int_{D_j - fZ/2}^{D_j + fZ/2} e^{2\pi i \gamma' z G_z t} dz = c_e(k,j) e^{2\pi i \gamma' D_j G_z t} \text{sinc}(\gamma' fZG\, t)$$

where sinc(x) is defined as $\sin(\pi x)/\pi x$; $\gamma'$ is $\gamma/2\pi$; and $G_z$ is said magnetic gradient waveform in the z direction applied during slab selection. A coefficient, $c_e(k,j)$ represents the complex phase of slab excitation.

A sequence of values for each slice encoding, k, the y encoding, and said RF pulse coefficient signs for the preferred embodiment are shown in Table 1.

After all said MR signals are received by said coil or coils in said MR apparatus, images from each slab are reconstructed using a standard 3D reconstruction algorithm. In the preferred embodiment, the reconstruction algorithm is one developed and used by General Electric Medical Systems. In this reconstruction algorithm for each x and y position in the measurement array, a one dimensional [z direction] Fourier Transform is performed over the 16 measurements in the direction of said 'z' phase encoding index. In the case of the spatial data set, this transform results in the localization of signal sources (imaged material) within the 16 slices along the z direction. In the case of the velocity data set, the transform places velocity data within 16 velocity ranges. Thus, spatial resolution in the z direction is lost for the velocity data set, but blood velocity in the z direction is resolved into 16 different ranges. After the one-dimensional Fourier Transforms in the z direction are completed for all x and y positions for both the spatial and velocity data, a 2D Fourier Transform (for the x-y plane) is performed for each slice image. Said slice images are then added to a system image data base in the order representing the physical position within the subject.

When the velocity component is measured at some angle, $\theta$, in the y-z plane, an identical reconstruction technique is used as described above. However, spatial resolution in the reconstructed slab is lost at an angle, $\theta$, with respect to the logical z direction (thin slab direction) and the zero velocity plane is at an angle $\theta$ with respect to the logical y axis.

Detail of the image in the sample is then reviewed using final images or by reprojecting values from said final images along straight lines through the sample using a standard display algorithm. Display algorithms are known to those skilled in the relevant art and are not part of this disclosure.

The preferred embodiment of the invention described herein utilizes a multiple overlapping thin slab acquisition (MOTSA) technique for sampling and processing MR signals. However, the inventive method of obtaining both spatial and velocity readouts from a single bipolar gradient pulse sequence can also be implemented in connection with conventional 2D and 3D MR imaging techniques. 2D and 3D MR imaging techniques are well known to the practitioners of ordinary skill in the art. Hence, the implementation of the inventive method in such systems and applications requires little further elaboration. Briefly, in order to perform 3D spatial and velocity imaging using the inventive technique, the gradient pulse sequences used will be comparable to those used with the MOTSA technique. However, the z gradient slab selection pulse will be reduced to select a thick 3D region. Both y and z phase encoding pulses will be stepped through a range of values during the data acquisition process. As with the conventional 3D imaging, spatial information will be read out following the z phase (slice) encoding pulse. In addition, as per the inventive technique, the second lobe of the bipolar z gradient pulse will be delayed relative to the first lobe, and will follow the spatial readout and precede the velocity readout. A z velocity phase encoding signal will be read out following the second lobe of the z bipolar gradient pulse, during the x velocity readout gradient. Choice of slice, dimensions, signal processing and image generation are performed according to standard 3D spatial and velocity imaging techniques. In order to use the inventive method in 2D imaging, the z slab selection gradient pulse is increased to select a thin slice. A bipolar slice selection pulse is applied in the y direction, and, as per the inventive technique, the lobes of the pulse are separated so that spatial information is read out following the first lobe and velocity information read out following the second lobe. Spatial and velocity images may be constructed for multiple two dimensional slices according to standard 2D imaging techniques.

While the invention has been described with reference to specific predefined embodiments, the description is illustrative of the invention and is not to be considered as limiting the invention. Various modifications and applications may occur to those skilled in the relevant art without departing from the true spirit and scope of the invention as defined by the appended claims.

TABLE 1

| Slice (k) | y value | RF pulse coefficient Centered slab | Half Offset slab |
|---|---|---|---|
| 1 | 1 | 1 | 1 |
| 1 | 2 | 1 | 1 |
| 1 | 3 | 1 | 1 |
| . | . | . | . |
| . | . | . | . |
| . | . | . | . |
| 1 | 256 | 1 | 1 |
| 2 | 1 | −1 | 1 |
| 2 | 2 | −1 | 1 |
| 2 | 3 | −1 | 1 |
| . | . | . | . |
| . | . | . | . |
| . | . | . | . |
| 2 | 256 | −1 | 1 |
| 3 | 1 | 1 | 1 |
| 3 | 2 | 1 | 1 |
| 3 | 3 | 1 | 1 |
| . | . | . | . |
| . | . | . | . |
| . | . | . | . |
| 3 | 256 | 1 | 1 |
| 4 | 1 | −1 | 1 |
| 4 | 2 | −1 | 1 |
| 4 | 3 | −1 | 1 |
| . | . | . | . |
| . | . | . | . |
| . | . | . | . |
| 4 | 256 | −1 | 1 |
| * | * | * | * |
| 16 | 1 | −1 | 1 |
| 16 | 2 | −1 | 1 |
| 16 | 3 | −1 | 1 |
| . | . | . | . |
| . | . | . | . |
| 16 | 256 | −1 | 1 |

We claim:

1. A method for simultaneously obtaining magnetic resonance (MR) spatial and velocity image data of a fluid flowing in a preselected volume portion of a sample, within a logical x, y, and z coordinate system, comprising the steps of:

(a) applying to said volume a main static magnetic field;

(b) selecting a slice within said volume by
  (i) applying to said volume a magnetic field gradient in the logical z axis direction, wherein said magnetic field gradient is a slice selection gradient;
  (ii) applying to said volume an RF pulse at a frequency band and of sufficient strength to tip nuclear spins of material in said slice to create a magnetic signal;

(c) applying to said volume a magnetic field gradient in the logical y axis direction for spatial phase encoding of said magnetic signal in the logical y axis dimension of said slice, wherein said magnetic field gradient in the logical y axis direction is a y axis phase encoding gradient;

(d) applying to said volume a magnetic field gradient in the logical x axis direction for spatial encoding of spatial components of said magnetic signal in the logical x axis direction, wherein said magnetic field gradient in the logical x axis direction is a spatial readout gradient.

(e) obtaining measurements of said magnetic signal while said spatial readout gradient is being applied;

(f) applying to said volume a second magnetic field gradient in the logical y axis direction for velocity phase encoding of said magnetic signal in the logical y axis direction of said slice, wherein said second magnetic field gradient is of opposite sign and essentially equal in area to said first magnetic field gradient in the logical y direction, and wherein said second magnetic field gradient in the logical y axis direction is a y axis velocity phase encoding gradient;

(g) applying to said volume a second magnetic field gradient in the logical x axis direction for spatial encoding of velocity-dependent components of said magnetic signal in the logical x axis direction, wherein said second magnetic field gradient in the logical x axis direction is a velocity readout gradient;

(h) obtaining measurements of said magnetic signal while said velocity readout gradient is being applied.

2. A method as described in claim 1 further comprising applying an additional magnetic gradient to spoil said magnetic signal after obtaining measurements of said magnetic signal.

3. A method as described in claim 1 further comprising reconstructing said magnetic signals measured during said spatial readout into a two-dimensional slice spatial image data set using a two-dimensional magnetic resonance reconstruction algorithm and reconstructing said magnetic signals measured during said velocity readout gradient into a two-dimensional slice velocity image data set using a two-dimensional magnetic resonance reconstruction algorithm.

4. A method as described in claim 1 further comprising:
   (i) reconstructing said magnetic signals into two-dimensional slice images,
   (j) repeating steps a through i for a desired number of additional slices, and
   (k) combining multiple said two-dimensional slice images to obtain a three-dimensional image of a portion of said sample.

5. A method for simultaneously obtaining spatial and velocity image data for providing a three-dimensional nuclear magnetic resonance (MR)image of fluid flowing in a preselected volume portion of a sample, within a logical x, y, and z axes coordinate system, comprising the steps of:
   (a) applying to said volume a main static magnetic field;
   (b) selecting a slab within said volume by
      (i) applying to said volume a magnetic field gradient in the logical z axis direction; and
      (ii) applying to said volume an RF pulse at a frequency band and of sufficient strength to tip nuclear spins of material in said slab to create a magnetic signal;
   (c) applying to said volume a magnetic field gradient in the logical y axis direction for spatial phase encoding of said magnetic signal in the logical y axis dimension of said slab, wherein said magnetic field gradient in the logical y axis direction is a y axis phase encoding gradient;
   (d) applying to said volume a second magnetic field gradient in the logical z axis direction for spatial phase encoding of said magnetic signal in the logical z axis direction of said slab, wherein said magnetic field gradient in the logical z axis direction is a z axis spatial phase encoding gradient;
   (e) applying to said volume a magnetic field gradient in the logical x axis direction for spatial encoding of spatial components of said magnetic signal in the logical x axis direction, wherein said magnetic field gradient in the logical x axis direction is a spatial readout gradient
   (f) obtaining measurements of said magnetic signal while said spatial readout gradient is being applied;
   (g) applying to said volume a third magnetic field gradient in the logical z axis direction for velocity phase encoding of said magnetic signal in the logical z axis direction of said slab, wherein said third magnetic field gradient is of opposite sign and essentially equal in area to said second magnetic field gradient in the logical z direction, and wherein said third magnetic field gradient in the logical z axis direction is a z axis velocity phase encoding gradient;
   (h) applying to said volume a second magnetic field gradient in the logical x axis direction for spatial encoding of velocity-dependent components of said magnetic signal in the logical x axis direction, wherein said second magnetic field gradient in the logical x axis direction is a velocity readout gradient;
   (i) obtaining measurements of said magnetic signal while said velocity readout gradient is being applied; and
   (j) repeating steps a through i multiple times to obtain a sufficient number of measurements to generate data from which three dimensional spatial and velocity images of said slab can be created; wherein said y axis and z axis phase encoding gradients are stepped through a combination of values requisite for the generation of a three dimensional image of said slab; and wherein the direction of said RF pulse is rotated to allow arbitrary slab position in the logical z axis direction.

6. A method as described in claim 5 further comprising applying an additional magnetic gradient to spoil said magnetic signal after obtaining measurements of said magnetic signal.

7. A method as described in claim 5 further comprising applying a second magnetic field gradient in the logical y axis direction of opposite sign to said first magnetic field gradient in the logical y axis direction wherein said second magnetic field gradient pulse in the logical y axis direction is a y phase rewinder pulse.

8. A method as described in claim 5 further comprising reconstructing said magnetic signals measured during said spatial readout into a spatial image data set using a three dimensional magnetic resonance reconstruction algorithm and reconstructing said magnetic signals measured during said velocity readout gradient into a velocity image data set using a three dimensional magnetic resonance reconstruction algorithm.

9. A method as described in claim 5 further comprising repeating steps a through j for a desired number of additional slabs in said volume.

10. A method as described in claim 5 further comprising
   (k) repeating steps a through j for a desired number of additional slabs in said volume; and
   (l) applying an additional magnetic gradient to spoil said magnetic signal after obtaining measurements of said magnetic signal.

11. A method as described in claim 7 further comprising reconstructing said magnetic signals measured during said spatial readout into a spatial image data set using a three dimensional magnetic resonance reconstruction algorithm and reconstructing said magnetic signals measured during said velocity readout gradient into a velocity image data set using a three dimensional magnetic resonance reconstruction algorithm.

12. A method as described in claim 7 further comprising repeating steps a through j for a desired number of additional slabs in said volume.

13. A method as described in claim 7 further comprising
   (k) repeating steps a through j for a desired number of additional slabs in said volume; and
   (l) applying an additional magnetic gradient to spoil said magnetic signal after obtaining measurements of said magnetic signal.

14. A method for simultaneously obtaining spatial and velocity image data for providing a three-dimensional nuclear magnetic resonance (MR) image of fluid flowing in a preselected volume portion of a sample, within a logical x, y, and z axes coordinate system, comprising the steps of:
   (a) applying to said volume a main static magnetic field;
   (b) selecting a slab within said volume by
      (i) applying to said volume a magnetic field gradient in the logical z axis direction; and
      (ii) applying to said volume an RF pulse at a frequency band and of sufficient strength to tip nuclear spins of material in said slab to create a magnetic signal;
   (c) applying to said volume a magnetic field gradient in the logical y axis direction for spatial phase encoding of said magnetic signal in the logical y axis dimension of said slab, wherein said magnetic field gradient in the logical y axis direction is a y axis phase encoding gradient;
   (d) applying to said volume a second magnetic field gradient in the logical z axis direction for spatial phase encoding of said magnetic signal in the logical z axis direction of said slab, wherein said magnetic field gradient in the logical z axis direction is a z axis spatial phase encoding gradient;
   (e) applying to said volume a magnetic field gradient in the logical x axis direction for spatial encoding of said magnetic signal in the logical x axis direction, wherein said magnetic field gradient in the logical x axis direction is a readout gradient.
   (f) obtaining measurements of said magnetic signal while said readout gradient is being applied;
   (g) applying to said volume a third magnetic field gradient in the logical z axis direction for velocity phase encoding of said magnetic signal in the logical z axis direction of said slab, wherein said third magnetic field gradient is of opposite sign and essentially equal in area to said second magnetic field gradient in the logical z direction, and wherein said third magnetic field gradient in the logical z axis direction is a z axis velocity phase encoding gradient;
   (h) applying to said volume a second magnetic field gradient in the logical x axis direction for spatial encoding of velocity-dependent components of said magnetic signal in the logical x axis direction, wherein said second magnetic field gradient is the logical x axis direction is a velocity readout gradient;
   (i) obtaining measurements of said magnetic signal while said velocity readout gradient is being applied;
   (j) repeating steps a through i multiple times to obtain a sufficient number of measurements to generate data from which three dimensional spatial and velocity images of said slab can be created; wherein said y axis and z axis phase encoding gradients are stepped through a combination of values requisite for the generation of a three dimensional image of said slab; and
   (k) repeating steps a through i for the imaging of a desired number of additional slabs, wherein said slabs are overlapped.

15. A method as described in claim 14 further comprising applying an additional magnetic gradient to spoil said magnetic signal after obtaining measurements of said magnetic signal.

16. A method as described in claim 14 further comprising applying a second magnetic field gradient in the logical y axis direction of opposite sign to said first magnetic field gradient in the logical y axis direction wherein said second magnetic field gradient pulse in the logical y axis direction is a y phase rewinder pulse.

17. A method as described in claim 14 further comprising reconstructing said magnetic signals measured during said spatial readout into a spatial image data set using a three dimensional magnetic resonance reconstruction algorithm and reconstructing said magnetic signals measured during said velocity readout gradient into a velocity image data set using a three dimensional magnetic resonance reconstruction algorithm.

18. A method as described in claim 16 further comprising reconstructing said magnetic signals measured during said spatial readout into a spatial image data set using a three dimensional magnetic resonance reconstruction algorithm and reconstructing said magnetic signals measured during said velocity readout gradient into a velocity image data set using a three dimensional magnetic resonance reconstruction algorithm.

19. A method for simultaneously obtaining spatial and velocity image data for providing a three-dimensional nuclear magnetic resonance (MR) image of fluid flowing in a preselected volume portion of a sample, within a logical x, y, and z axes coordinate system, wherein fluid flow is phase encoded in a direction which lies in the logical y-z plane at some angle $\theta$ relative to the logical z axis, comprising the steps of:
   (a) applying to said volume a main static magnetic field;
   (b) selecting a slab within said volume by
      (i) applying to said volume a magnetic field gradient in the logical z axis direction wherein said magnetic field gradient is a slab selection gradient; and
      (ii) applying to said volume an RF pulse at a frequency band and of sufficient strength to tip nuclear spins of material in said slab to create a magnetic signal;
   (c) applying to said volume a magnetic field gradient in the logical y axis direction for spatial phase encoding of said magnetic signal in the logical y axis dimension of said slab, wherein said magnetic field gradient in the logical y axis direction is a y axis phase encoding gradient;
   (d) applying to said volume a second magnetic field gradient in the logical z axis direction for spatial phase encoding of said magnetic signal in the logical z axis direction of said slab, wherein said magnetic field gradient in the logical z axis direction is a z axis spatial phase encoding gradient;

(e) applying to said volume a magnetic field gradient in the logical x axis direction for spatial encoding of spatial components of said magnetic signal in the logical x axis direction, wherein said magnetic field gradient in the logical x axis direction is a spatial readout gradient.

(f) obtaining measurements of said magnetic signal while said spatial readout gradient is being applied;

(g) applying to said volume a third magnetic field gradient in the logical z axis direction for velocity phase encoding of said magnetic signal in the logical z axis direction of said slab, wherein said third magnetic field gradient is of opposite sign to said second magnetic field gradient in the logical z direction and with a magnitude depending upon the angle $\theta$, and wherein said third magnetic field gradient in the logical z axis direction is a z axis velocity phase encoding gradient;

(h) applying to said volume a second magnetic field gradient in the logical y axis direction for velocity phase encoding of said magnetic signal in the logical y axis direction of said slab, wherein said second magnetic field gradient in the logical y direction is of opposite sign to said first magnetic field gradient in the logical y direction and with a magnitude dependent upon the angle $\theta$, and wherein said second magnetic field gradient in the logical y axis direction is a y axis velocity phase encoding gradient;

(i) applying to said volume a second magnetic field gradient in the logical x axis direction for spatial encoding of velocity-dependent components of said magnetic signal in the logical x axis direction, wherein said second magnetic field gradient in the logical x axis direction is a velocity readout gradient;

(j) obtaining measurements of said magnetic signal while said velocity readout gradient is being applied; and (k) applying a fourth pulse in the logical z direction of opposite sign to said second magnetic field gradient in the z direction and with a magnitude dependent upon the angle $\theta$, wherein said fourth pulse in the logical z direction pulse is a z phase rewinding pulse.

(l) applying a third pulse in the logical y direction of opposite sign to said first magnetic field gradient in the logical y direction and with a magnitude dependent upon the angle $\theta$, wherein said third pulse in the logical y direction is a y phase rewinding pulse.

(m) repeating steps a through l multiple times to obtain a sufficient number of measurements to generate data from which three dimensional spatial and velocity images of said slab can be created; wherein said y axis and z axis phase encoding gradients are stepped through a combination of values requisite for the generation of a three dimensional image of said slab; and wherein the direction of said RF pulse is rotated to allow arbitrary slab position in the logical z axis direction.

* * * * *

UNITED STATES PATENT AND TRADEMARK OFFICE
CERTIFICATE OF CORRECTION

PATENT NO. : 5,225,779
DATED : August 28, 1991
INVENTOR(S) : Dennis L. Parker, et al It is certified that error appears in the above-identified patent and that said Letters Patent is hereby corrected as shown below:

On the title page, item (54) title :

"HYBRID MAGNETIC ARESONANCE SPATIAL AND VELOCITY IMAGING"

should be

"HYBRID MAGNETIC [A]RESONANCE SPATIAL AND VELOCITY IMAGING".

Column 16, line 34 of the issued patent, $$s_{k,j} = \int c_e(k,j)\, W_j(z)\, m(z)\, e^{2\pi i \gamma'(zk\alpha A_z)}\, dz + s_n$$

should be $$s_{k,j} = \int c_e(k,j)\, W_j(z)\, m(z)\, e^{2\pi i \gamma'(zk\Delta A_z)}\, dz + s_n.$$

UNITED STATES PATENT AND TRADEMARK OFFICE
CERTIFICATE OF CORRECTION

PATENT NO. : 5,225,779
DATED : August 28, 1991
INVENTOR(S) : Dennis L. Parker, et al.

It is certified that error appears in the above-indentified patent and that said Letters Patent is hereby corrected as shown below:

Column 21, line 44 of the issued patent (in claim 5),

"(MR]"

should be

"(MR)".

Signed and Sealed this

Fifth Day of October, 1993

*Attest:*

BRUCE LEHMAN

*Attesting Officer*     *Commissioner of Patents and Trademarks*